United States Patent

Nagata et al.

[15] 3,652,347

[45] Mar. 28, 1972

[54] METHOD FOR MANUFACTURING A SEMICONDUCTOR DEVICE

[72] Inventors: Minoru Nagata; Kozi Sato, both of Kodaira-shi, Japan

[73] Assignee: Hitachi, Ltd., Tokyo, Japan

[22] Filed: Nov. 4, 1968

[21] Appl. No.: 772,913

[30] Foreign Application Priority Data

Nov. 6, 1967 Japan....................................42/70971

[52] U.S. Cl.....................................148/187, 29/577, 29/578, 148/190, 317/235 Y

[51] Int. Cl...............................................................H01l 7/44

[58] Field of Search.....................148/187, 190; 29/577, 578; 317/235 Y

[56] References Cited

UNITED STATES PATENTS

| | | | |
|---|---|---|---|
| 3,347,720 | 10/1967 | Bryan et al. | 148/187 |
| 3,401,319 | 9/1968 | Watkins | 317/235 Y |
| 3,443,174 | 5/1969 | Busen et al. | 148/187 |

*Primary Examiner*—L. Dewayne Rutledge
*Assistant Examiner*—R. A. Lester
*Attorney*—Craig and Antonelli

[57] ABSTRACT

A method for manufacturing a lateral transistor, formed by selectively diffusing a P type emitter region on one principal surface of an N type silicon substrate and introducing acceptor impurity in said emitter region and in one portion of the surface of said substrate at a prescribed distance from said emitter region, thereby forming an emitter region and a P type collector region which have a high surface impurity concentration.

13 Claims, 7 Drawing Figures

INVENTORS
MINORU NAGATA
KOZI SATO

BY Craig & Antonelli
ATTORNEYS

INVENTORS

MINORU NAGATA

KOZI SATO

BY

Craig & Antonelli

ATTORNEYS

METHOD FOR MANUFACTURING A SEMICONDUCTOR DEVICE

This invention relates to an improved method for manufacturing a semiconductor device, particularly a lateral transistor.

A semiconductor device such as a diffusion type transistor, a semiconductor integrated circuit, etc., in which the diffusion technique is applied to a silicon substrate is an important element in the semiconductor field. Usually PN junctions are formed by repeating the diffusion step in the same portion of the substrate. Recently another type of PN junction element not formed by the repetition of diffusion has been developed, i.e., a lateral transistor, which is mainly used in a semiconductor integrated circuit.

The present monolithic silicon integrated circuit consists mainly of an NPN transistor alone which is obtained by repeating diffusion along the depth of a semiconductor substrate. No practical PNP transistor has yet been obtained. One method for obtaining NPN and PNP transistors simultaneously is to introduce an acceptor impurity, e.g., phosphorus into two portions of a substrate while the base region of the NPN transistor is diffused. Thus the base and collector regions of the PNP transistor, which utilizes a lateral current flow, is obtained. According to this method in which the emitter and the collector are simultaneously formed by the same diffusion treatment, the base width is determined by the dimension of a mask. The emitter and collector regions formed simultaneously have the same impurity concentration. Therefore, any improvement cannot be observed in the current gain $h_{FE}$ and the collector reverse breakdown voltage. Generally the current gain is expressed by the product of the emitter efficiency, the transport factor, and the collector efficiency. For a constant base impurity concentration the emitter efficiency rises as the emitter impurity concentration increases. However, the collector impurity concentration can not be made large in view of the breakdown voltage. The transport factor is related to the base width and the hole diffusion length in the base region. The base width is desirably small while the hole diffusion length is large. When the base and emitter regions of a transistor are formed by repeated diffusion, as in the case of a planar transistor, the base width can be controlled so as to be extremely thin by the diffusion temperature and time with relatively high accuracy. However, when the base region is formed between the emitter and collector regions which are formed in advance by simultaneous diffusion, it is hard for the base region to be controlled thin because it is determined by the accuracy of a diffusion pattern.

Therefore, one object of this invention is to provide an improved diffusion method capable of obtaining a semiconductor device having good electrical characteristics.

Another object of this invention is to provide an improved method for obtaining a lateral transistor in which the current gain, the collector reverse breakdown voltage, etc., are improved.

Still another object of this invention is to provide a method for manufacturing a lateral transistor in which the base width is accurately controlled.

A further object of this invention is to provide a simple method for manufacturing an integrated circuit containing NPN transistors and high efficiency PNP transistors.

As will be evident from the following explanation, the gist of this invention is a method for manufacturing a semiconductor device comprising forming a first region of a second conductivity type in one principal surface of a semiconductor substrate of one conductivity type and forming by a selective diffusion method second and third regions of the second conductivity type in said principal surface of said substrate simultaneously and separately from each other so that a portion of said second region is overlaid at least on one portion of said first region. Therefore, if this invention is applied to the manufacture of a transistor, an impurity concentration in the main portion of an emitter region can be made sufficiently large and hence the current gain can be increased. Further, the collector impurity concentration is decreased so that the breakdown voltage is maintained at a satisfactory value. The peripheral portion of the emitter region operates effectively to further increase the current gain. Since the emitter junction is formed simultaneously with the collector and the high impurity concentration region does not extend from the emitter region, the base width is accurately defined. Considering these facts the inventive diffusion method can overcome the defects observed in the prior art method, and provides a semiconductor device having excellent characteristics.

Above and other objects and features of this invention will be made more apparent from the following explanation taken in conjunction with the accompanying drawings, in which;

FIG. 1 is a front perspective sectional view of a lateral transistor.

FIGS. 2*a*, 2*b* and 2*c* are the main sectional view of a semiconductor wafer in each manufacturing step according to one embodiment of this invention.

The invention will be explained with reference to the drawings.

Figure 1:
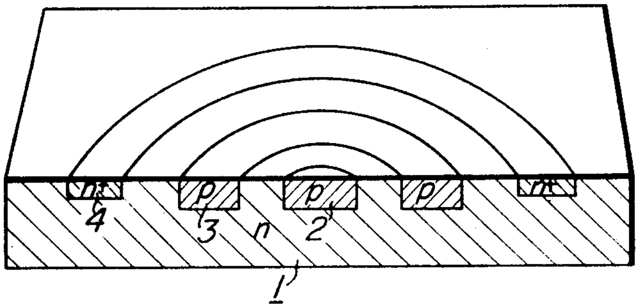

For the sake of better understanding of this invention FIG. 1 shows an example of lateral transistors. 1 is a base region of N type silicon substrate, 2 is an emitter region formed in one portion of the substrate and doped with P type impurity, 3 is a collector region doped with P type impurity and formed in such a sense as to surround the emitter region at a constant distance therefrom, and 4 is a base electrode led-out portion of $N^+$ type diffusion layer formed to surround the collector region at a constant distance therefrom.

This structure is obtained by introducing an acceptor in the surface of substrate 1 to form the emitter region 2 and the collector region 3 simultaneously.

Next concrete embodiments of this invention will be explained.

Figure 2A:
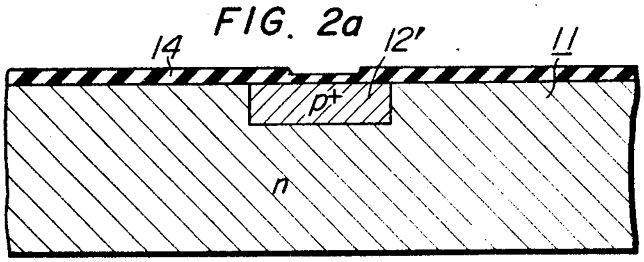
Figure 2B:
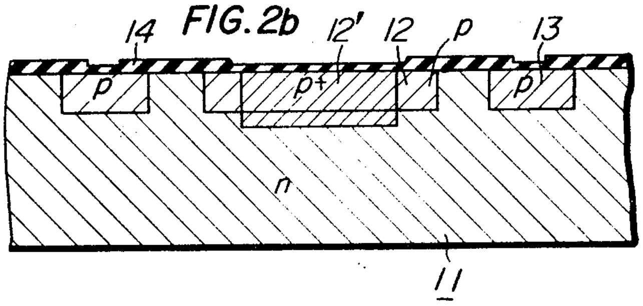
Figure 2C:
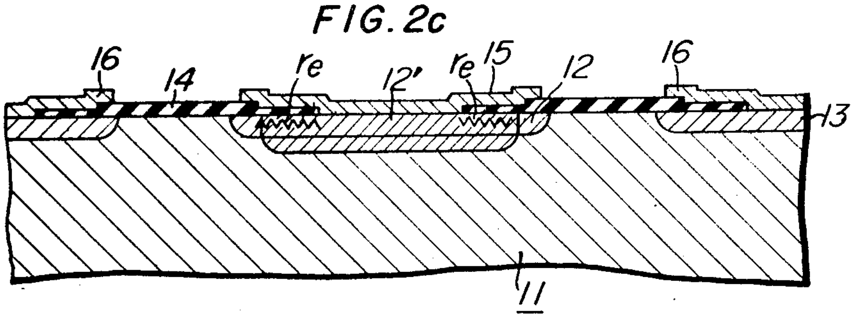

FIGS. 2*a*, 2*b* and 2*c* show the manufacturing steps of a PNP lateral transistor according to one embodiment of this invention. A silicon wafer or substrate is cut out from an N type silicon monocrystalline bar to obtain a surface parallel to the (111) or (100) crystal plane. As shown in FIG. 2*a*, an insulating film 14 such as a silicon oxide film with a thickness of about a few thousands A. is formed on the surface of substrate 11. A first window is perforated in the insulating film 14 for the next diffusion treatment. Relatively high concentration of acceptor impurity such as boron is diffused in one portion of the surface of a substrate through the first window, thereby to form a $P^+$ type region 12′ with a thickness of about $3\mu$ and a surface impurity concentration of about $10^{19}$ atoms/cc. The first window is covered with a new oxide film.

A second window 12 having a diameter of 1 to $3\mu$, larger than that of the $P^+$ region 12′, is perforated around the first window in the film 14, and a third ring type window is further perforated at a distance of about $10\mu$ from the second window so as to surround the second window. The whole P type region 12′ is exposed by the second window. The end portion of PN junction around the region 12′ is also exposed. An acceptor impurity such as boron is diffused in the substrate through the second and third windows as shown in FIG. 2*b*, thereby forming a P type diffused region 12 (emitter region) and a ring type collector region 13 which have a surface impurity concentration of about $10^{18}$ atoms/cc. and a depth of 2 to $3\mu$. The second and third windows are next covered with newly grown silicon oxide. The base width is determined substantially by the gap between the second and third windows and by the diffusion depth of the regions 12 and 13. In the above embodiment the base width of the transistor is about 4 to $6\mu$.

In the above manufacturing method the position of the second and third windows should be defined so that the $P^+$ type region 12′ does not reach the collector region 13 over the emitter region 12. By doing so the base width is easily controlled by the distance between the second and third diffusion windows. The emitter efficiency and the current gain are effectively increased by increasing the emitter impurity concentration. It is desirable in order to increase the emitter efficiency that the distance between the $P^+$ type region 12′ and the emitter region 12 is less than the diffusion length of the minority carrier (electron) in the emitter, i.e., 1 to $10\mu$.

FIG. 2*c* shows the main sectional view of a PNP lateral transistor in which electrodes 15 and 16 are formed on the emitter and the collector respectively. The characteristic of this transistor is that the emitter efficiency and current gain are increased because the emitter contains a high impurity concentration region.

As seen in FIG. 2*c*, due to the structure according to this invention the resistance $r_e$ between the emitter electrode 15 and the PN junction formed between the base region 11 and the peripheral portion of emitter 12 is reduced. Namely, the emitter resistance component is decreased substantially uniformly over the whole portion in the emitter region 12. This has the advantage that the minority carrier injected from the emitter is prevented from concentrating in the central bottom portion of the emitter region 12.

Figure 5:
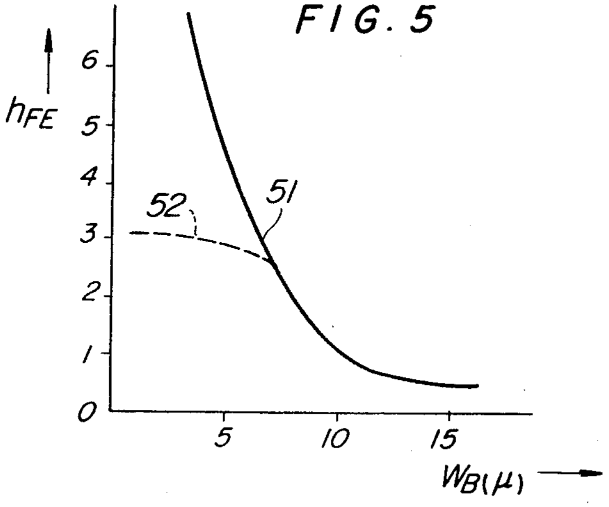
FIG. 5 shows curves for comparing the effect of the inventive transistor with that of a prior art one.

This invention has another advantage that even if the base width is decreased the current gain $h_{FE}$ does not become saturated (See the curve 51 shown in FIG. 5). As shown in FIG. 5, the current gain is nearly in inversely proportion to the base width. While the current gain of a conventional transistor becomes saturated as indicated by the broken line 52 in FIG. 5 when the base width is less than about $7\mu$, this is not the case in the transistor of this invention.

It is particularly to be noted that the current gain $h_{FE}$ depends on the crystal surface. The current gain $h_{FE}$ of a lateral transistor formed in the exposed (111) crystal surface of a wafer is 1 to 1.5 in the conventional method, whereas it is increased to 2 to 3 in the present method. It is found that when the lateral transistor is formed in the semiconductor substrate having the surface parallel to the (100) crystal plane the present method can increase $h_{FE}$ as much as 5 to 10.

Figure 4:
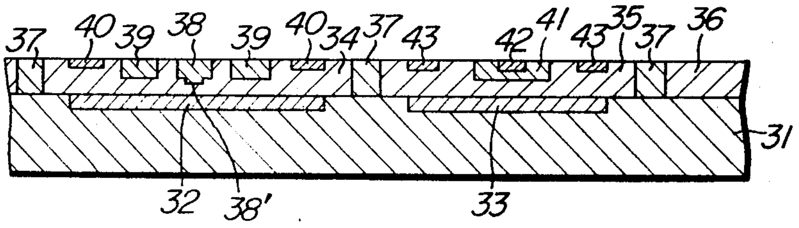
FIG. 4 is a partial sectional view of a semiconductor integrated circuit means according to a further embodiment of this invention.

Usually the above transistor is combined with an NPN transistor to be integrated in a semiconductor substrate as shown in FIG. 4, in which on the surface of a P type semiconductor substrate, $N^+$ type buried layers 32 and 33 and an N type epitaxial grown semiconductor layer are formed. The semiconductor layer is divided into isolated portions 34, 35 and 36 by the P type isolation layer 37.

One example of the manufacturing method of the integrated circuit means as shown in FIG. 1 will be explained hereinafter. The formation of the isolation layer 37 is done as follows. A $P^+$ type highly doped region is preliminarily formed in a usual substrate. An acceptor impurity is diffused from the surface of the epitaxial layer to meet there the highly doped $P^+$ type region. Simultaneously with isolation diffusion an acceptor impurity is introduced in a prescribed portion of the N type region 34 to form the highly doped emitter region 38′ (the region corresponds to the portion 12′ in FIG. 2*a*). Thereafter the P type base region 41 of the NPN transistor, and the emitter region 38 and the collector region 39 of the PNP transistor are formed by simultaneous diffusion. The emitter region 42 and the collector contact portion 43 of the NPN transistor and the base contact portion 40 of the PNP transistor are formed by diffusing a high concentration of donor impurity.

As described above the application of this invention to an integrated circuit means is easily done without any additional step. It is evident therefore that the advantage of this invention is available in the field of semiconductor integrated circuit.

Figure 3:
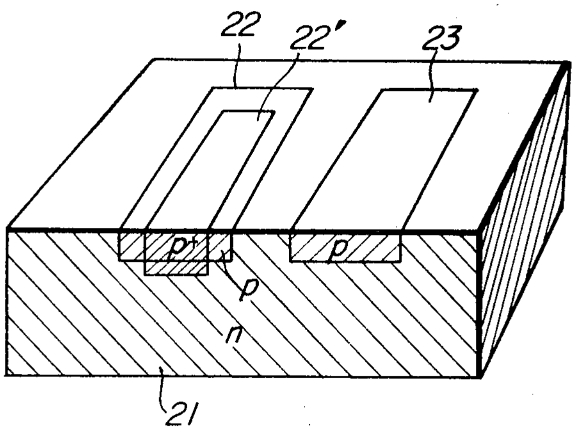
FIG. 3 is a front perspective sectional view of a finished lateral transistor according to the method in another embodiment of this invention.

FIG. 3 shows another embodiment where this invention is applied to a stripe type diffusion transistor. In this figure, 21 is a base of an NPN type silicon substrate, 22′ a $P^+$ type diffused region, 22 and 23 are the P type diffused emitter and collector respectively. The $P^+$ type diffused region 22′ should not extend further than the emitter 22. But here it is sufficient to take care that the region 22′ does not extend towards the region 23.

Although explanation has been given only of a few embodiments of this invention, this invention is not restricted by such examples. Various modifications may be made by those skilled in the art without departing from the appended claims.

What is claimed is:

1. A method for manufacturing a semiconductor device comprising:
forming a first region of a second conductivity type in one principal surface of a semiconductor substrate of one conductivity type; and
forming by a selective diffusion method second and third regions of the second conductivity type in said principal surface of said substrate simultaneously conductivity separately from each other such that one portion of said second region is overlaid at least on one portion of said first region.

2. A method for manufacturing a semiconductor device according to claim 1, wherein said first region of second conductivity type has a relatively high impurity concentration while said second and third regions of second conductivity type have a relatively low impurity concentration.

3. A method for manufacturing a semiconductor device according to claim 1, wherein said first region of second conductivity type is formed by selective diffusion more deeply than said second and third regions of second conductivity type.

4. A method for manufacturing a semiconductor device according to claim 2, wherein said first region of second conductivity type is formed by selective diffusion more deeply than said second and third regions of second conductivity type.

5. A method for manufacturing a semiconductor device comprising:
forming a first diffused region of a second conductivity type with a relatively high impurity concentration in one principal surface of a semiconductor substrate of a first conductivity type;
forming on said principal surface an insulating film having a first window to expose at least one portion of said first region and one portion of the surface of a substrate adjacent thereto, and a second window at a prescribed distance from said first window; and
introducing an impurity determining the second conductivity type in said principal surface of said substrate through said first and second windows, thereby forming simultaneously in said principal surface of said substrate second and third regions of the second conductivity type having a relatively low impurity concentration separately from each other.

6. A method for manufacturing a semiconductor device according to claim 5, wherein said second region of second conductivity type is formed more adjacent to said third region of second conductivity type than to said first region of second conductivity type, and the distance between said second and third regions is defined shorter than the diffusion length of a minority carrier in said substrate.

7. A method for manufacturing a semiconductor device according to claim 5, wherein the distance between the first and second regions is defined shorter than the diffusion length of a minority carrier in the first and second regions.

8. A method for manufacturing a semiconductor device according to claim 6, wherein the distance between the first and second regions is defined shorter than the diffusion length of a minority carrier in the first and second regions.

9. A method for manufacturing a semiconductor device according to claim 7, wherein said substrate is N type silicon, said impurity of second conductivity type is an acceptor impurity and said insulating film is silicon oxide.

10. A method for manufacturing a semiconductor device according to claim 8, wherein said substrate is N type silicon, said impurity of second impurity type is an acceptor impurity and said insulating film is silicon oxide.

11. A method for manufacturing a semiconductor device comprising the steps of:

a. preparing a semiconductor substrate of a first conductivity type;
b. forming at least two first and second diffused layers of a second conductivity type partially in the surface of said substrate;
c. forming in the surface of said substrate at least a third diffused layer of the first conductivity type in such a way as to surround said first and second diffused layers;
d. growing epitaxially from vapor phase a semiconductor layer of second conductivity type on the surface of said substrate;
e. introducing an impurity determining the first conductivity type selectively from the first surface portion of said semiconductor layer positioned on said third diffused layer into said semiconductor layer to meet said third diffused layer, thereby forming on said first and second diffused layers first and second isolated regions of the first conductivity type respectively separated from each other by PN junctions;
f. forming simultaneously with the formation of said isolated regions a fourth diffused layer of the first conductivity type with a high impurity concentration in the second surface portion of said first isolated region positioned on said first diffused layer;
g. forming simultaneously and separately from each other fifth and sixth diffused regions of the first conductivity type with a low impurity concentration in the third surface portion of said first isolated region positioned on said first diffused region such that one portion of the fifth diffused region is overlaid at least on one portion of said fourth diffused layer;
h. forming simultaneously with the formation of said fifth and sixth diffused layers a seventh diffused layer of the first conductivity type with a low impurity concentration on the fifth surface portion of said second isolated region positioned on said second diffused layer;
i. forming eighth, ninth and 10th diffused layers of the second conductivity type with a high impurity concentration in the sixth surface portion of said first isolated region positioned on said first diffused layer, in the seventh surface portion of said second isolated region positioned on said second diffused layer, and in the surface portion of said seventh diffused layer respectively;
j. connecting electrode means to said fourth, sixth and eighth diffused layers, thereby to form a first transistor in said first isolated region; and
k. connecting electrode means to said seventh, ninth and 10th diffused layers, thereby to form a second transistor in said second isolated region.

12. A method for manufacturing a semiconductor device according to claim 11 wherein said substrate is N type silicon and said second conductivity type is P type.

13. A method for manufacturing a semiconductor device comprising:

forming a first region of a second conductivity type in one principal surface of a semiconductor substrate of one conductivity type; and forming by a selective diffusion method second and third regions of the second conductivity type in said principal surface of said substrate separately from each other such that one portion of said second region is overlaid at least on one portion of said first region.

* * * * *